United States Patent
Vollrath et al.

(10) Patent No.: US 6,981,175 B2
(45) Date of Patent: Dec. 27, 2005

(54) MEMORY AND METHOD FOR EMPLOYING A CHECKSUM FOR ADDRESSES OF REPLACED STORAGE ELEMENTS

(75) Inventors: Joerg Vollrath, Richmond, VA (US); Philip Moore, Richmond, VA (US)

(73) Assignee: Infineon Technologies AG, Munich (DE)

( * ) Notice: Subject to any disclaimer, the term of this patent is extended or adjusted under 35 U.S.C. 154(b) by 618 days.

(21) Appl. No.: 09/967,008

(22) Filed: Sep. 28, 2001

(65) Prior Publication Data

US 2003/0065973 A1 Apr. 3, 2003

(51) Int. Cl.$^7$ ................................................ G06F 11/00
(52) U.S. Cl. ................................................ 714/7; 714/710
(58) Field of Search ........................... 714/5–8, 48, 54, 714/702, 710–711, 718, 763–768; 365/200, 201, 230.01, 230.02, 51, 52

(56) References Cited

U.S. PATENT DOCUMENTS

| | | | | |
|---|---|---|---|---|
| 4,653,051 A | * | 3/1987 | Sugimura et al. | ........... 714/755 |
| 5,170,400 A | * | 12/1992 | Dotson | ........... 714/755 |
| 5,666,312 A | * | 9/1997 | Robertson | ........... 365/189.02 |
| 5,673,231 A | * | 9/1997 | Furutani | ........... 365/203 |
| 5,677,917 A | * | 10/1997 | Wheelus et al. | ........... 714/726 |
| 5,831,917 A | * | 11/1998 | Vollrath | ........... 365/200 |
| 6,141,267 A | * | 10/2000 | Kirihata et al. | ........... 365/200 |
| 6,262,926 B1 | * | 7/2001 | Nakai | ........... 365/200 |
| 6,408,401 B1 | * | 6/2002 | Bhavsar et al. | ........... 714/7 |

OTHER PUBLICATIONS

Joerg Vollrath and Randall Rooney, "Pseudo Fail Bit Map Generation for RAMs during Component Test and Burn–In in a Manufacturing Environment," Test Conference, 2001. Proceedings. Int'l, IEEE, pp. 768–775, (Oct. 30–Nov. 1, 2001).

Jorg Vollrath, Ulf Lederer, and Thomas Hladschik, "Compressed Bit Fail Maps for Memory Fail Pattern Classification," European Test Workshop, 2000. Proceedings. IEEE, pp. 125–130, (May 23–26, 2000).

U.S. Appl. No. 09/455,855, filed Dec. 7, 1999, entitled "Efficient Bit Fail Map Compression Strategy".

U.S. Appl. No. 09/931,125, filed Aug. 16, 2001, entitled "Pseudo Fail Bit Map Generation For RAMs During Component Test and Burn–In In A Manufacturing Environment".

* cited by examiner

*Primary Examiner*—Dieu-Minh Le
(74) *Attorney, Agent, or Firm*—Brinks Hofer Gilson & Lione

(57) ABSTRACT

A memory includes: a memory array having a plurality of storage elements; a plurality of replacement storage elements; a plurality of address fuse units, each having a plurality of fusible links and being operable to store a replacement address, each replacement address identifying one of the storage elements of the memory array to be replaced by an associated one of the replacement storage elements and forming a respective $2^m$ bit row or $2^n$ bit column of a fuse array; a vector generator operable to produce a $2^n$ bit row vector based on the rows of the fuse array and to produce a $2^m$ bit column vector based on the columns of the fuse array; and a compression unit operable to produce a row checksum from the row vector and to produce a column checksum from the column vector.

40 Claims, 6 Drawing Sheets

| Row Vector | Address | | Bit Selection | | | |
|---|---|---|---|---|---|---|
| | $A_2$ | $A_1$ | $A_1=0$ | $A_1=1$ | $A_2=0$ | $A_2=1$ |
| RV0 | 0 | 0 | x | | x | |
| RV1 | 0 | 1 | | x | x | |
| RV2 | 1 | 0 | | | | x |
| RV3 | 1 | 1 | | x | | x |
| | | | ↓ | ↓ | ↓ | ↓ |
| | | | RCS0 | RCS1 | RCS2 | RCS3 |

FIGURE 4

| Column Vector | Address | | Bit Selection | | | |
|---|---|---|---|---|---|---|
| | $A_2$ | $A_1$ | $A_1=0$ | $A_1=1$ | $A_2=0$ | $A_2=1$ |
| CV0 | 0 | 0 | x | | x | |
| CV1 | 0 | 1 | | x | x | |
| CV2 | 1 | 0 | | | | x |
| CV3 | 1 | 1 | | x | | x |
| | | | ↓ | ↓ | ↓ | ↓ |
| | | | CCS0 | CCS1 | CCS2 | CCS3 |

FIGURE 5

MEMORY AND METHOD FOR EMPLOYING A CHECKSUM FOR ADDRESSES OF REPLACED STORAGE ELEMENTS

BACKGROUND OF THE INVENTION

The present invention relates to the use of at least one checksum to monitor whether stored addresses of replacement storage elements are correct.

In a memory circuit, e.g., a dynamic random access memory (DRAM) or a field programmable logic device, a plurality of memory cells are typically arranged in rows and columns for addressable access. For example, a DRAM chip may include 256 million cells (or more), which are arranged in an array of rows (activated by word lines) and columns (activated by bit lines).

In a conventional DRAM chip, one or more of the millions of cells of the memory array may be defective. In order to avoid the need to discard an entire DRAM chip, redundant cells are provided that may be substituted for the one or more defective cells. Usually, if a particular cell in the memory array is determined to be defective (e.g., during a manufacturing/test process), the entire row and/or column containing the defective cell is usually replaced by a redundant row and/or column. Herein, rows and/or columns of cells may be referred to as storage elements.

A conventional technique of substituting a defective storage element of the memory array with a replacement storage element involves using address fuses associated with the replacement storage element. The address fuses contain the address of the defective storage element of the memory array. Each address fuse includes a fusible link that may take on an unfused state or may be permanently modified to take on a fused state. The fused state may represent one of a logic zero (0) and one (1), and the unfused state may represent the other of the logic zero and one. In use, when the defective storage element of the memory array is addressed, a comparison of the incoming address and the address stored in the address fuses will match. This indicates that the replacement storage element should be accessed instead of the defective storage element of the memory array.

The conventional technique for replacing a defective storage element of the memory array with a replacement storage element does not permit a determination of whether the replacement address is correct (e.g., whether the replacement address has been corrupted in some way). Consequently, an inappropriate storage element of the memory array may be replaced by a replacement storage element if the associated address fuses contain an incorrect replacement address. This problem is exacerbated when a plurality of replacement addresses are stored as would be the case when many rows of memory cells are replaced and many columns of memory cells are replaced.

In view of the foregoing, there is a need in the art for a new memory and method in which it is possible to monitor whether one or more of the replacement addresses stored have been corrupted and, further, to determine which of the addresses have been corrupted.

SUMMARY OF THE INVENTION

In accordance with at least one aspect of the present invention a memory includes: a memory array having a plurality of storage elements; a plurality of replacement storage elements; a plurality of address fuse units, each having a plurality of fusible links and being operable to store a replacement address, each replacement address identifying one of the storage elements of the memory array to be replaced by an associated one of the replacement storage elements and forming a respective $2^m$ bit row or $2^n$ bit column of a fuse array; a vector generator operable to produce a $2^n$ bit row vector based on the rows of the fuse array and to produce a $2^m$ bit column vector based on the columns of the fuse array; and a compression unit operable to produce a row checksum from the row vector and to produce a column checksum from the column vector.

The vector generator is preferably operable to produce each bit of the row vector by determining a logic combination of the $2^m$ bits of a corresponding one of the rows of the fuse array. For example, the vector generator may be operable to produce each bit of the row vector by determining an XOR of adjacent ones of the $2^m$ bits of the corresponding row of the fuse array. More particularly, the $2^m$ bits of the corresponding row of the fuse array are sequentially bit 1, bit 2, . . . bit $2^m$ and the vector generator may be operable to produce each bit of the row vector by determining a first XOR of bits 1 and 2, a second XOR of a next bit and the first XOR, . . . and a $(2^m-1)$th XOR of bit $2^m$ and a previous XOR.

The vector generator is also preferably operable to produce each bit of the column vector by determining a logic combination of the $2^n$ bits of a corresponding one of the columns of the fuse array. For example, the vector generator may be operable to produce each bit of the column vector by determining an XOR of adjacent ones of the $2^n$ bits of the corresponding column of the fuse array. More particularly, the $2^n$ bits of the corresponding column of the fuse array are sequentially bit 1, bit 2, . . . bit $2^n$ and the vector generator may be operable to produce each bit of the column vector by determining a first XOR of bits 1 and 2, a second XOR of a next bit and the first XOR, . . . and a $(2^n-1)$th XOR of bit $2^n$ and a previous XOR.

The compression unit is preferably operable to produce each bit of the row checksum by determining a logic combination of at least some of the $2^n$ bits of the row vector. For example, the compression unit may be operable to produce each bit of the row checksum by determining an XOR combination of at least some of the $2^n$ bits of the row vector. More particularly, each bit of the row vector may be represented by an address of n bits, An, . . . A2, A1, one of a least significant bit (LSB) and a most significant bit (MSB) of the row vector may be represented by address An=0, . . . A2=0, A1=0, and each sequential bit may be represented by an address incremented by one. The compression unit is preferably operable to produce an ith bit of the row checksum by determining a logic combination of an ith set of bits of the row vector for which the respective Aj address bits are 0, where i=1, 3, 5, n-1, and j=1, 2, 3, . . . n; and the compression unit is operable to produce a kth bit of the row checksum by determining a logic combination of a kth set of bits of the row vector for which the respective Aj address bits are 1, where k=2, 4, 6, . . . n.

The compression unit may produce each ith bit and each kth bit of the row checksum by determining an XOR of the respective ith and kth sets of bits of the row vector. For example, when the bits within each of the respective ith and kth sets of bits are sequentially bit 1, bit 2, . . . bit $2^{n-1}$, the compression unit is preferably operable to produce each ith bit and each kth bit of the row checksum by determining a first XOR of bits 1 and 2, a second XOR of a next bit and the first XOR, . . . and a $(2^{n-1}-1)$th XOR of bit $2^{n-1}$ and a previous XOR.

The compression unit is operable to produce each bit of the column checksum by determining a logic combination of at least some of the $2^m$ bits of the column vector. For example, the compression unit may be operable to produce each bit of the column checksum by determining an XOR combination of at least some of the $2^m$ bits of the column vector. More particularly, each bit of the column vector may be represented by an address of m bits, Am, ... A2, A1, one of a least significant bit (LSB) and a most significant bit (MSB) of the column vector may be represented by address Am=0, ... A2=0, A1=0, and each sequential bit may be represented by an address incremented by one. The compression unit is preferably operable to produce an ith bit of the column checksum by determining a logic combination of an ith set of bits of the column vector for which the respective Aj address bits are 0, where i=1, 3, 5, ... m−1, and j=1, 2, 3, ... m; and the compression unit is preferably operable to produce a kth bit of the column checksum by determining a logic combination of a kth set of bits of the row vector for which the respective Aj address bits are 1, where k=2, 4, 6, ... m.

The compression unit may produce each ith bit and each kth bit of the column checksum by determining an XOR of the respective ith and kth sets of bits of the column. For example, when the bits within each of the respective ith and kth sets of bits are sequentially bit 1, bit 2, ... bit $2^{n-1}$, the compression unit is preferably operable to produce each ith bit and each kth bit of the column checksum by determining a first XOR of bits 1 and 2, a second XOR of a next bit and the first XOR, ... and a $(2^{n-1}-1)$th XOR of bit $2^{n-1}$ and a previous XOR.

The memory preferably further includes at least one storage unit operable to store the row checksum and the column checksum. The at least one storage unit may include a plurality of fusible links to store the row checksum and the column checksum.

The memory preferably further includes an error detector operable to compare the stored row checksum and a subsequently determined row checksum for a difference therebetween, and to compare the stored column checksum and a subsequently determined column checksum for a difference therebetween. The error detector may be operable to determine which of the replacement addresses is faulty based on at least one of the difference between the stored row checksum and the subsequent row checksum, and the difference between the stored column checksum and the subsequent column checksum. More particularly, the error detector is preferably operable to determine faulty ones of the ith and kth bits of the subsequently determined row checksum based on the difference between the stored row checksum and the subsequently determined row checksum. Further, the error detector may be operable to determine one of the addresses of n bits contributing to all of the ith and kth sets of bits that correspond to the faulty bits of the subsequently determined row checksum. And the error detector is preferably operable to determine that the faulty replacement address is one that corresponds to the bit of the row vector that is represented by the determined address of n bits. Similar functions are preferably carried out by the error detector with respect to the column checksum.

In accordance with at least one further aspect of the present invention, a method for producing the row checksum and/or the column checksum is contemplated. The method may be achieved utilizing suitable apparatus, such as that discussed hereinabove and/or utilizing any of the known processors that are operable to execute instructions of a software program. In the latter case, the software program preferably causes the processor (and/or any peripheral systems) to execute certain steps in accordance with one or more aspects of the present invention. Still further, the software program may be stored on a suitable storage medium, such as a floppy disk, a memory chip, etc. for transportability and/or distribution. In either case, the steps and/or actions of the method preferably correspond to at least some of the functions of the apparatus described hereinabove.

Other aspects, features, advantages, etc., will be apparent to one skilled in the art when the disclosure herein is taken in conjunction with the accompanying drawings.

BRIEF DESCRIPTION OF THE DRAWINGS

For the purposes of illustrating the invention, there are shown in the drawings, forms that are presently preferred, it being understood, however, that the invention is not limited to the precise arrangements and instrumentalities shown.

FIG. 4 is a truth table illustrating preferred bit combinations in accordance with one or more aspects of the present invention;

FIG. 5 is a truth table illustrating preferred bit combinations in accordance with one or more aspects of the present invention.

DETAILED DESCRIPTION

Figure 1:
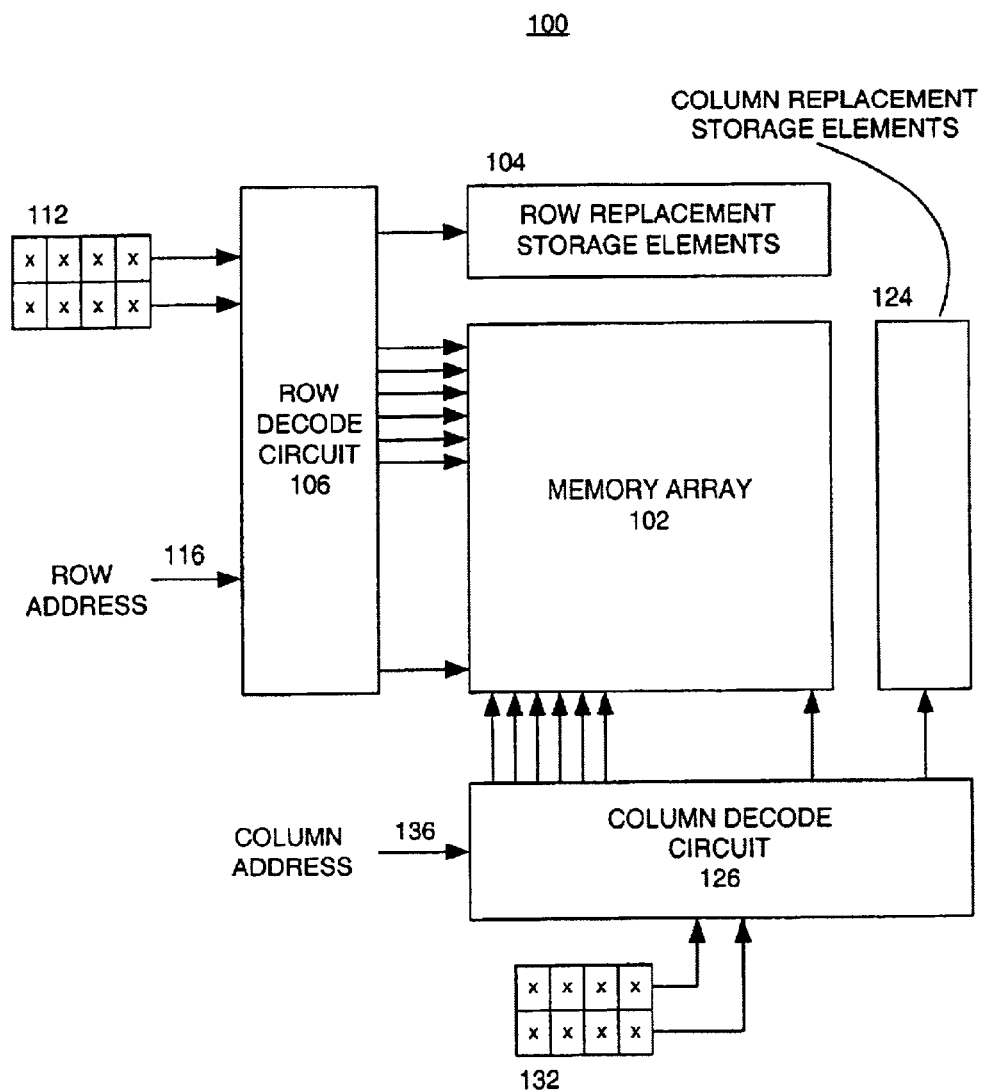
FIG. 1 is a block diagram of a memory in accordance with one or more aspects of the present invention.

Referring now to the drawings, wherein like numerals indicate like elements, there is shown in FIG. 1 a memory 100 in accordance with one or more aspects of the present invention. The memory 100 preferably includes a memory array 102 having a plurality of storage elements. Referring to portions of the memory 100 associated with row elements of the memory array 102, the memory 100 preferably further includes a plurality of row replacement storage elements 104, a row decode circuit 106, and a plurality of row address storage units 112. Referring now to the portions of the memory 100 associated with columns of the memory array 102, the memory 100 preferably includes a plurality of column replacement storage elements 124, a column decode circuit 126, and a plurality of column address storage units 132.

For purposes of simplicity, a detailed discussion of the components associated with the row elements of the memory 100 will now be made, it being understood, however, that this discussion may be readily applied to the components associated with the columns of the memory array 102. The row decode circuit 106 is preferably operable to activate one of the row storage elements of the memory array 102 or one of the row replacement storage elements 104 in response to a row address input at 116. The row decode circuit 106 preferably activates a row storage element of the memory array 102 when the row address input at 116 does not identify a row storage element of the memory array 102 that is to be replaced (e.g., a defective row storage element). On the other hand, the row decode circuit 106 preferably activates a row replacement storage element 104 when the row address input at 116 addresses a defective row storage element of the memory array 102 that is to be replaced. Addresses (or replacement addresses) of any row storage elements of the memory array 102 that are to be replaced (e.g., because they are defective) are preferably stored in respective ones of the row address storage units 112. The row address storage units 112 and/or the column address storage units 132 preferably include fusible links to store the bits of the respective replacement addresses.

In use, a row address input at 116 (and/or a column address input at 136) is received by the row decode circuit 106 (and/or the column decode circuit 126, respectively) and compared against the replacement addresses stored in the row address storage units 112 (and/or the column address storage units 132, respectively). If there is no match between the row address input at 116 (and/or the column address input at 136) and any of the stored replacement addresses, the row decode circuit 106 (and/or the column decode circuit 126) decodes the row address and/or column address input at 116 and/or 136 to one of the row storage elements and/or column storage elements of the memory array 102 and permits access thereto. If, however, a match is obtained between the row address and/or column address input at 116 and/or 136 and one of the stored replacement addresses, than access to the addressed row storage element and/or column storage element of the memory array 102 will not be permitted. In particular, the row decode circuit 106 (and/or the column decode circuit 126) permits access to one of the row replacement storage elements 104 (and/or the column replacement storage elements 124) associated with the address storage unit 112 and/or 132 containing the matched replacement address.

Figure 2:
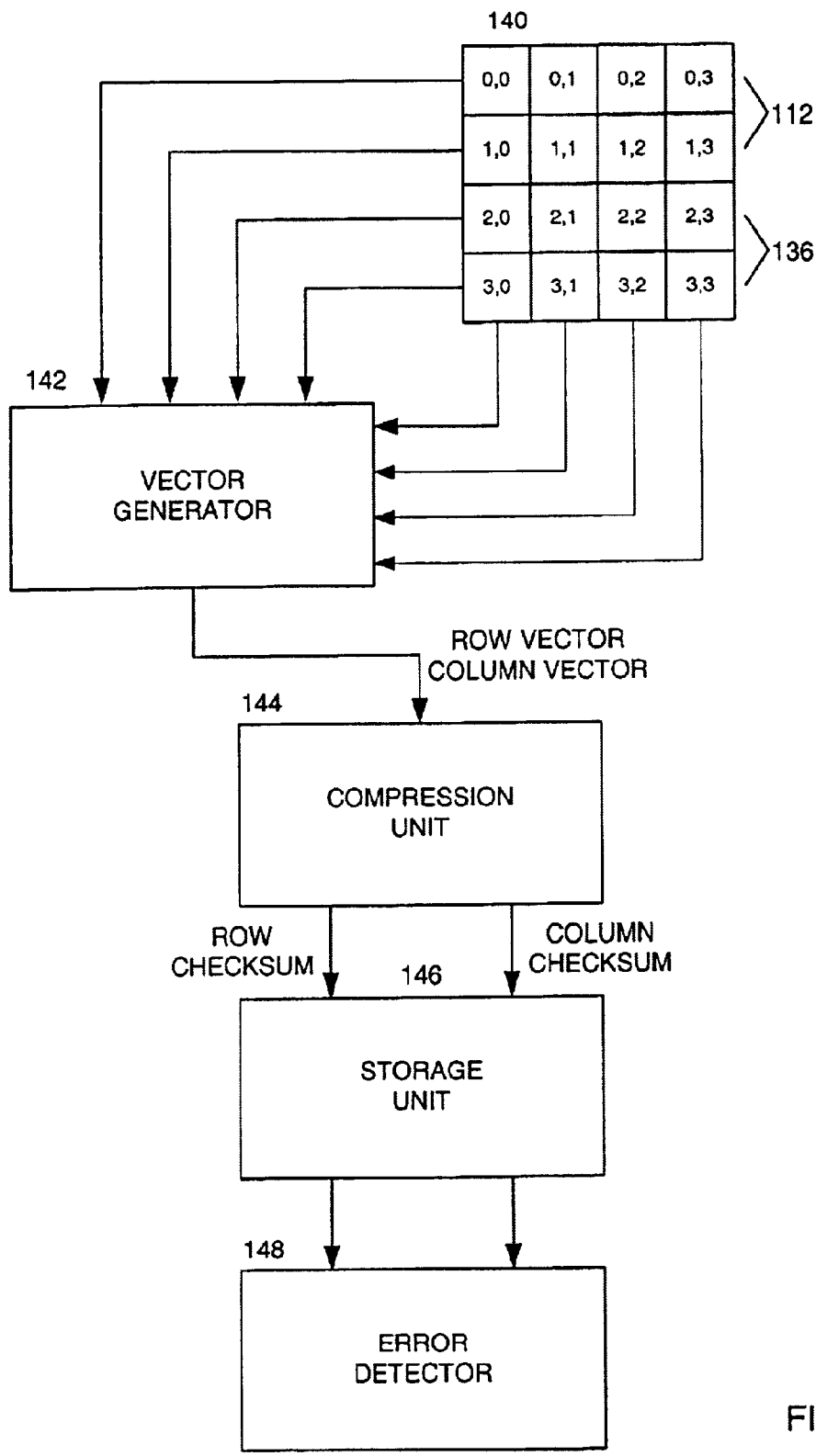
FIG. 2 is a block diagram illustrating further functional units of the memory of FIG. 1.

With reference to FIG. 2, in accordance with one or more aspects of the present invention, the memory array 100 preferably includes the capability of detecting whether one or more of the replacement addresses stored in the row address storage units 112 and/or the column address storage units 132 have been corrupted. In particular, the memory 100 preferably includes a fuse array 140, a vector generator 142, a compression unit 144, a storage unit 146, and an error detector 148.

Each replacement address preferably forms a respective row and/or column of the fuse array 140. As shown, the replacement addresses stored in the row address storage units 112 and the replacement addresses stored in the column address storage units 132 form respective $2^m$ bit rows of the fuse array 140, where m=2 in this example. It is understood, however, that the replacement addresses of the row and/or column address storage units 112, 132 may alternatively form respective $2^n$ bit columns of the fuse array 140 without departing from the spirit and scope of the invention. In any case, the fuse array 140 preferably includes a plurality of $2^m$ bit rows and $2^n$ columns formed from the replacement addresses, where m and n are any integers. Each bit of the fuse array 140 may be represented by a pair of numbers indicating its position in terms of row and column. For example, a bit of the fuse array located in row 1 and column 1 of the fuse array 140 may be labeled 0,0, while a bit located in row 4 and column 4 may be labeled 3,3. Although a 4×4 bit (m=2, n=2) fuse array 140 is shown, it is understood that any size array may be employed without departing from the spirit and scope of the invention.

The vector generator 142 is preferably operable to produce a $2^n$ bit row vector based on the rows of the fuse array 140. The vector generator 142 is also preferably operable to produce a $2^m$ bit column vector based on the columns of the fuse array 140. For example, the vector generator 142 may produce a given bit of the row vector by determining a logic combination of the $2^m$ bits of a corresponding one of the rows of the fuse array 140. Similarly, the vector generator may produce a given bit of the column vector by determining a logic combination of the $2^n$ bits of a corresponding one of the columns of the fuse array.

Figure 3:
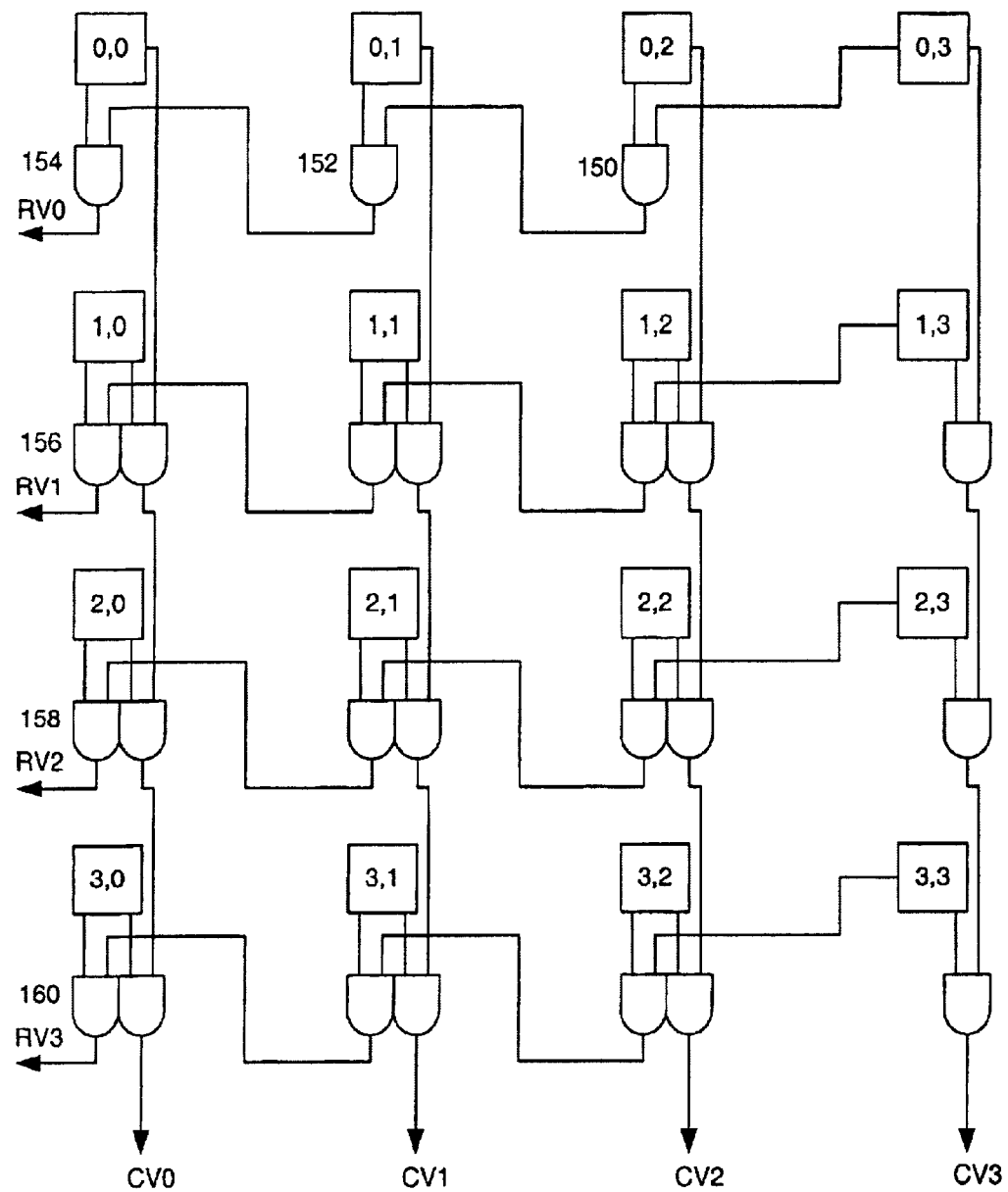
FIG. 3 is a partial schematic diagram illustrating a preferred circuit implementation of certain functions of the memory of FIGS. 1 and 2.

With reference to FIG. 3, a preferred circuit implementation of the vector generator 142 is shown. The bits of the fuse array 140 are labeled 0,0; 0,1; . . . 3,3, while the remaining circuit elements (e.g., the logic gates and interconnections) form the vector generator 142. In particular, the vector generator 142 includes a plurality of exclusive OR (XOR) gates coupled to certain bits of the fuse array 140 such that the row vector (of $2^n$ bits) is produced at the left of the schematic labeled bits RV0, RV1, RV2, RV3. Further, the XOR gates of the vector generator 140 are preferably arranged such that the column vector (of $2^m$ bits) is produced at the bottom of the schematic labeled CV0, CV1, CV2, CV3. It is preferred that a given bit of the row vector is determined by taking an XOR of adjacent ones of the bits of a corresponding row of the fuse array 140. For example, RV0 is preferably produced by taking a first XOR of bits 3 and 4 using gate 150, taking a second XOR of a next bit (bit 2) and the output of the first XOR gate 150 using XOR gate 152, and taking a third XOR of the next bit (bit 1) and the previous XOR output of gate 152 using XOR gate 154. It is noted that $2^m-1$ dual input XOR gates are employed for each $2^m$ bit row of the fuse array 140.

In a similar way, the vector generator 142 is preferably operable to produce a given bit of the column vector by determining an XOR of adjacent ones of the $2^n$ bits of the corresponding column of the fuse array 140. For example, bit CV0 of the column vector is preferably produced by taking a first XOR of bits 1 and 2 of the fuse array 140 using XOR gate 156, taking a second XOR of a next bit (bit 3) and the output of the first XOR gate 156 using XOR gate 158, and taking a third XOR of a next bit (bit 4) and the previous XOR output of gate 158 using gate 160. It is noted that $2^n-1$ dual input XOR gates are employed to produce each bit of the column vector from a $2^n$ bit column of the fuse array 140.

Referring again to FIG. 2, the compression unit 144 is preferably operable to produce a row checksum from the row vector and to produce a column checksum from the column vector. More particularly, the compression unit 144 is preferably operable to produce a given bit of the row checksum by determining a logic combination of at least some of the $2^n$ bits of the row vector. Similarly, the compression unit 144 is preferably operable to produce a given bit of the column checksum by determining a logic combination of at least some of the $2^m$ bits of the column vector. It is most preferred that the logic combinations employed by the compression unit 144 to produce the row checksum and the column checksum include XOR operations.

Reference is now made to FIG. 4, which is a truth table illustrating which of the $2^n$ bits of the row vector are preferably used to produce respective bits of the row checksum. Each bit of the row vector may be represented by an address of n bits, e.g., An, . . . A2, A1. With n=2, each bit of the row vector is represented by a two-bit address A2, A1. An assumption is made that one of the least significant bit (LSB) and the most significant bit (MSB) of the row vector is represented by address 0,0. As shown in the example illustrated in FIG. 4, it is assumed that bit RV0 is the LSB of the row vector and it is represented by address 0,0. Each sequential bit of the row vector (i.e., RV1, RV2, RV3) is represented by an incremental address, i.e., 0,1; 1,0; and 1,1, respectively.

The particular bits of the row vector used to produce a given bit of the row checksum are determined by testing the bits of the addresses A2, A1. In particular, a first bit, RCS0, of the row checksum is preferably produced from those bits of the row vector for which the address bit A1=0 (e.g., RV0, RV2). A second bit, RCS1, of the row checksum is preferably produced from those bits of the row vector for which the address bit A1=1 (e.g., RV1, RV3). A next bit, RCS2, of the row checksum is preferably produced by those bits of the row vector for which address bit A2=0 (e.g., RV0, RV1). And a next bit, RCS3, of the row checksum is preferably produced from those bits of the row vector for which address bit A2=1 (e.g., RV2, RV3).

While the above is representative of a specific example of the invention, in general, the compression unit 144 is preferably operable to produce an ith bit of the row checksum by determining a logic combination of an ith set of bits of the row vector for which the respective Aj address bits are 0, where i=1, 3, 5, . . . n−1, and j=1, 2, 3, . . . n. The compression unit 144 is preferably further operable to produce a kth bit of the row checksum by determining a logic combination of a kth set of bits of the row vector for which the respective Aj address bits are 1, where k=2, 4, 6, . . . n.

Reference is now made to FIG. 5, which is a truth table illustrating which of the $2^m$ bits of the column vector are preferably used to produce respective bits of the column checksum. Each bit of the column vector may be represented by an address of m bits, e.g., Am, . . . A2, A1. With m=2, each bit of the column vector is represented by a two-bit address A2, A1. An assumption is made that one of the LSB and the MSB of the column vector is represented by address 0,0. As shown in the example illustrated in FIG. 5, it is assumed that bit CV0 is the LSB of the column vector and it is represented by address 0,0. Each sequential bit of the column vector (i.e., CV1, CV2, CV3) is represented by an incremental address, i.e., 0,1; 1,0; and 1,1, respectively.

The particular bits of the column vector used to produce a given bit of the column checksum are determined by testing the bits of address A2, A1. In particular, a first bit, CCS0, of the column checksum is preferably produced from those bits of the column vector for which the address bit A1=0 (e.g., CV0, CV2). A second bit, CCS1, of the column checksum is preferably produced from those bits of the column vector for which the address bit A1=1 (e.g., CV1, CV3). A next bit, CCS2, of the column checksum is preferably produced by those bits of the column vector for which address bit A2=0 (e.g., CV0, CV1). And a next bit, CCS3, of the column checksum is preferably produced from those bits of the column vector for which address bit A2=1 (e.g., CV2, CV3).

While the above is representative of a specific example of the invention, in general, the compression unit 144 is preferably operable to produce an ith bit of the column checksum by determining a logic combination of an ith set of bits of the column vector for which the respective Aj address bits are 0, where i=1, 3, 5, . . . m−1, and j=1, 2, 3, . . . m. The compression unit 144 is preferably further operable to produce a kth bit of the column checksum by determining a logic combination of a kth set of bits of the column vector for which the respective Aj address bits are 1, where k=2, 4, 6, . . . m.

Figure 6:
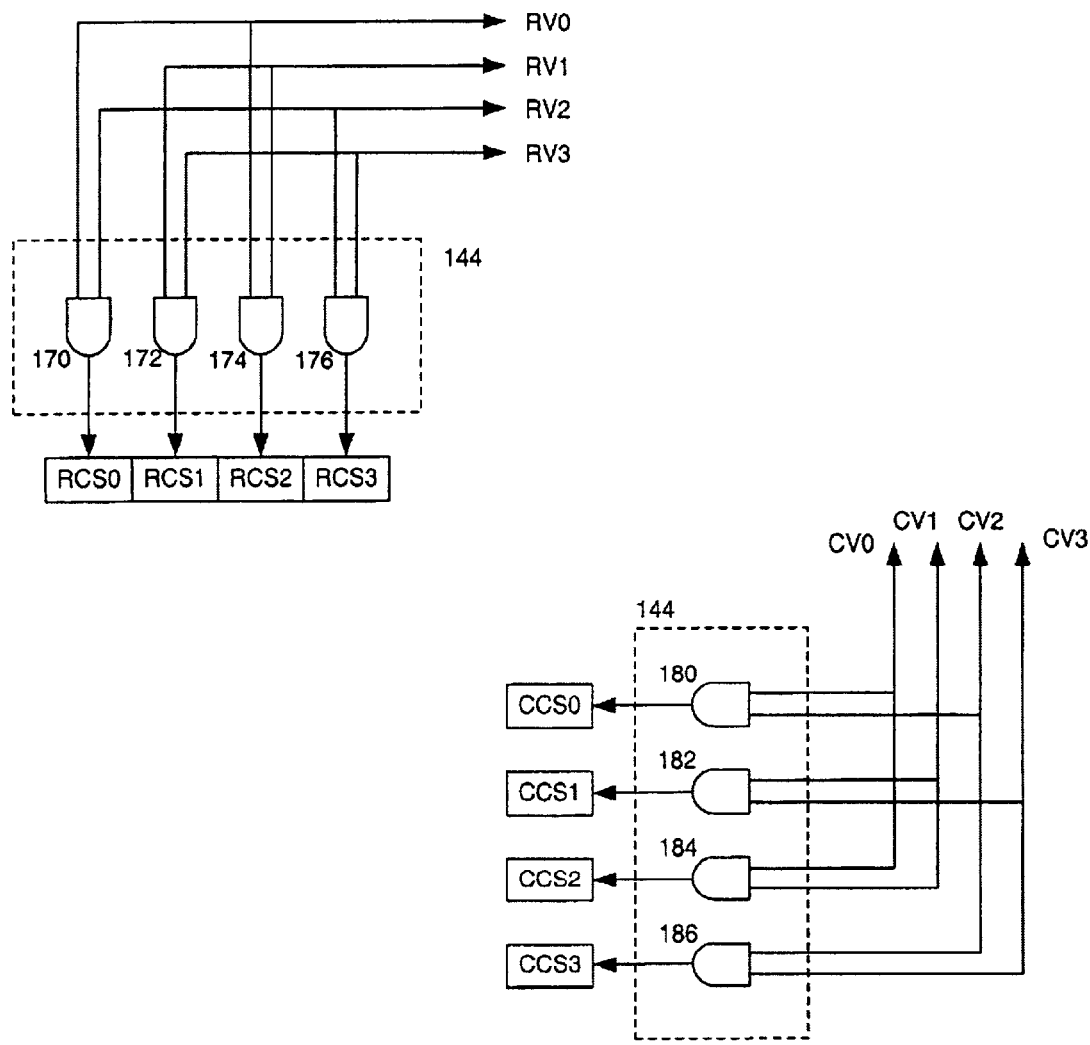
FIG. 6 is a partial schematic diagram illustrating a preferred circuit implementation of further functional units of the memory of FIGS. 1 and 2.

With reference to FIG. 6, the compression unit 144 is preferably operable to produce each bit of the row checksum by determining an XOR of the respective bits of the row vector. For example, bit RCS0 of the row checksum is preferably produced by determining an XOR of the respective set of bits of the row vector shown in FIG. 4. More particularly, bits RV0 and RV2 of the row vector may be considered the first set of bits from which the first bit of the row checksum, RCS0, is produced. To that end, the compression circuit 144 (FIG. 6) preferably includes a dual input XOR gate 170 that receives bits RV0 and RV2 of the row vector to produce bit RCS0 of the row checksum. Turning again to FIG. 4, bits RV1 and RV3 of the row vector may be considered a second set of bits from which the second bit, RCS1, of the row checksum is determined. The compression circuit 144 (FIG. 6) preferably includes a dual input XOR gate 172 receiving bits RV1 and RV3 from the row vector to produce bit RCS1 of the row checksum. Further XOR gates 174, 176 are preferably provided to produce bits RCS2 and RCS3 of the row checksum.

It is noted that the row checksum includes 2×n bits. In the example discussed above, n=2 and, therefore, the number of bits of the row vector used to determine each bit of the row checksum is 2. In general, however, n may be any integer and the number of bits of the row vector used to produce each bit of the row checksum may be expressed by $2^{n-1}$. Thus, for example, where n=3, four bits of the row vector will be utilized to produce each bit of the row checksum. In that case, additional XOR gates (e.g., dual input XOR gates) are preferably employed in the compression circuit 144 (FIG. 6) to produce each bit of the row checksum. In general, the ith and kth sets of bits of the row vector may be numbered bit 1, bit 2, . . . bit $2^{n-1}$ and the compression unit 144 may produce each bit of the row checksum by determining a first XOR of bits 1 and 2, a second XOR of a next bit and the first XOR output, . . . and a $(2^{n-1}-1)$th XOR of bit $2^{n-1}$ and a previous XOR result.

The compression unit 144 is preferably further operable to produce each bit of the column checksum by determining an XOR of the respective bits of the column vector. For example, bit CCS0 of the column checksum is preferably produced by determining an XOR of the respective set of bits of the column vector shown in FIG. 5. More particularly, bits CV0 and CV2 of the column vector may be considered the first set of bits from which the first bit of the column checksum, CCS0, is produced. To that end, the compression circuit 144 preferably includes a dual input XOR gate 180 that receives bits CV0 and CV2 of the column vector to produce bit CCS0 of the column checksum. Turning again to FIG. 5, bits CV1 and CV3 of the column vector may be considered a second set of bits from which the second bit, CCS1, of the row checksum is determined. The compression circuit 144 preferably includes a dual input XOR gate 182 (FIG. 6) receiving bits CV1 and CV3 from the column vector to produce bit CCS1 of the column checksum. Further XOR gates 184, 186 are preferably provided to produce bits CCS2 and CCS3 of the column checksum.

It is noted that the column checksum includes 2×m bits. In the example discussed above, m=2 and, therefore, the number of bits of the column vector used to determine each bit of the column checksum is 2. In general, however, m may be any integer and the number of bits of the column vector used to produce each bit of the column checksum may be expressed by $2^{m-1}$. Thus, for example, where m=3, four bits of the column vector will be utilized to produce each bit of the column checksum. In that case, additional XOR gates (e.g., dual input XOR gates) are preferably employed in the compression circuit 144 to produce each bit of the column checksum. In general, the ith and kth sets of bits of the column vector may be numbered bit 1, bit 2, . . . bit $2^{m-1}$ and the compression unit 144 may produce each bit of the column checksum by determining a first XOR of bits 1 and 2, a second XOR of a next bit and the first XOR output, . . . and a $(2^{m-1}-1)$th XOR of bit $2^{m-1}$ and a previous XOR result.

Turning again to FIG. 2, the storage unit 146 is preferably operable to store the row checksum and the column checksum (preferably when it is known that the replacement addresses of the fuse array 140 are known to be error free). It is preferred that the storage unit 146 includes a plurality of fusible links to store the respective row checksum and column checksum.

The error detector 148 is preferably operable to receive the row checksum and the column checksum from the storage unit 146 and compare them against a subsequent row checksum and a subsequent column checksum, respectively. For example, it may be desirable to determine whether the replacement addresses stored in the respective row address storage units 112 and column address storage units 132 (FIG. 1) are error free. To that end, a subsequent row checksum and column checksum is preferably produced using the vector generator 142 and compression unit 144 (FIG. 2) and compared to the respective row checksum and column checksum stored in the storage unit 146. If a difference exists between the subsequent row checksum and the stored row checksum and/or the subsequent column checksum and the stored column checksum, then at least one replacement address stored in the row address storage units 112 and/or the column address storage units 132 are corrupted.

The error detector 148 is preferably operable to determine which of the replacement addresses of the fuse array 140 is faulty based on the difference between the stored row checksum and the subsequent row checksum and/or the difference between the stored column checksum and the subsequent column checksum. By way of example and with reference to FIG. 4, the error detector 148 may be operable to determine which of the ith and kth bits of the subsequently determined row checksum are faulty based on the difference between the stored row checksum and the subsequently determined row checksum. For example, if the stored row checksum is 1, 0, 0, 1 (i.e., RCS0=1, RCS1=0, RCS2=0, and RCS3=1) and the subsequently determined row checksum is 1, 1, 1, 1, then a difference exits between the stored row checksum and the subsequently determined row checksum. In particular, bits RCS1 and RCS2 of the subsequently determined row checksum are in error. Put another way, the k=2 bit of the subsequently determined row checksum, RCS1, and the i=3 bit of the subsequently determined row checksum, RCS2, are faulty bits.

The error detector 148 is preferably further operable to utilize the faulty bits of the subsequently determined row checksum to identify which of the replacement addresses of the fuse array 140 is faulty. To illustrate this, it is assumed for purposes of discussion that the replacement address defining the second row of the fuse array 140 has been corrupted (FIG. 3). More particularly, it is assumed that bit 1, 2 has changed state and, therefore, has caused the second bit, RV1, of the row vector to change state. Turning to FIG. 4, the erroneous state of bit RV1 of the row vector would cause bits RCS1 and RCS2 of the row checksum to change state and yield faulty values. Indeed, the address A2, A1 representing bit RV1 of the row vector contributes to the ith and kth sets of bits that correspond to bits RCS1 and RCS2 of the subsequent row checksum. The error detector 148 is preferably operable to determine which one of the addresses A2, A1 contribute to all of the ith and kth sets of bits that correspond to the faulty bits of the subsequently determined row checksum. In this example, address 0, 1, i.e., A2=0 and A1=1, contributes to both of the k=2 set of bits and the i=3 set of bits that correspond to the faulty bits, RCS1 and RCS2, respectively, of the subsequently determined row checksum. The error detector 148 may then be operable to determine that the faulty replacement address is one that corresponds to the bit of the row vector that is represented by the determined address. In the above example, the faulty replacement address (row 2 of the fuse array 140, FIG. 3) corresponds to the second bit, RV1, of the row vector that is represented by address 0,1 (A2=0, A1=1).

In order to determine whether a column of the fuse array 140 contains faulty bits, the error detector 148 may be operable to determine which of the ith and kth bits of the subsequently determined column checksum are faulty based on the difference between the stored column checksum and the subsequently determined column checksum. For example, if the stored column checksum is 0,1,1,0 (i.e., CCS0=0, CCS1=1, CCS2=1, and CCS3=0) and the subsequently determined column checksum is 1,1,1,1, then a difference exists between the stored column checksum and the subsequently determined column checksum. In particular, bits CCS0 and CCS3 of the subsequently determined column checksum are in error. Put another way, the i=1 bit of the subsequently determined column checksum, CCS0, and the k=4 bit of the subsequently determined column checksum, CCS3, are faulty bits.

The error detector 148 is preferably further operable to utilize the faulty bits of the subsequently determined column checksum to identify which of the columns of bits of the fuse array 140 is faulty. To illustrate this, it is assumed for the purposes of discussion that the bits defining the third column of the fuse array 140 has been corrupted (FIG. 3). More particularly, it is assumed that bit 1,2 has changed state and, therefore, has caused the third bit, CV2, of the column vector to change state. Turning to FIG. 4, the erroneous state of bit CV2 of the column vector would cause bits CCS0 and CCS3 of the column checksum to change state and yield faulty values. Indeed, the address A2, A1 representing bit CV2 of the column vector contributes to the ith and kth sets of bits that correspond to bits CCS0 and CCS3 of the subsequent column checksum. The error detector 148 is preferably operable to determine which one of the addresses A2, A1 contribute to all of the ith and kth sets of bits that correspond to the faulty bits of the subsequently determined column checksum. In this example, address 1,0, i.e., A2=1 and A1=0, contributes to both of the i=1 set of bits and the k=4 set of bits that correspond to the faulty bits, CCS0 and CCS3, respectively, of the subsequently determined column checksum. The error detector 148 may then be operable to determine that the faulty column of bits is one that corresponds to the bit of the column vector that is represented by the determined address. In the above example, the faulty column of bits (column 3 of the fuse array 140, FIG. 3) corresponds to the third bit, CV2, of the column vector that is represented by address 1,0 (A2=1, A1=0).

When only one bit of the fuse array 140 is faulty, for example bit 1,2, the error detector 148 is preferably operable to detect that bit. In essence, this is achieved by determining which bit of the fuse array 140 is shared by the row of bits and by the column of bits that are identified as containing a faulty bit. In the above example, the second row and the third column of the fuse array 140 were determined to contain a faulty bit. Bit 1,2 is common to this row and column and, therefore, is determined to be the faulty bit.

In accordance with at least one further aspect of the present invention, a method for producing the row checksum and/or the column checksum is contemplated. The method may be achieved utilizing suitable hardware, such as that illustrated above in FIGS. 1–6 and/or utilizing any of the known processors that are operable to execute instructions of a software program. In the latter case, the software program preferably causes the processor (and/or any peripheral systems) to execute certain steps in accordance with one or more aspects of the present invention. Still further, the software program may be stored on a suitable storage medium, such as a floppy disk, a memory chip, etc. for transportability and/or distribution. In either case, the steps and/or actions of the method preferably correspond to at least some of the functions described hereinabove with respect to the hardware of FIGS. 1–6.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

We claim:

1. A memory, comprising:

a memory array having a plurality of storage elements;

a plurality of replacement storage elements;

a plurality of address fuse units, each having a plurality of fusible links and being operable to store a replacement address, each replacement address identifying one of the storage elements of the memory array to be replaced by an associated one of the replacement storage elements and forming a respective row or column of a fuse array having $2^m$ bit rows and $2^n$ bit columns;

a vector generator operable to produce a $2^n$ bit row vector based on the $2^m$ bit rows of the fuse array and to produce a $2^m$ bit column vector based on the $2^n$ bit columns of the fuse array; and a compression unit operable to produce a row checksum from the row vector and to produce a column checksum from the column vector.

2. The memory of claim 1, wherein: the vector generator is operable to produce each bit of the row vector by determining a logic combination of the $2^m$ bits of a corresponding one of the rows of the fuse array; and the vector generator is operable to produce each bit of the column vector by determining a logic combination of the $2^n$ bits of a corresponding one of the columns of the fuse array.

3. The memory of claim 2, wherein: the vector generator is operable to produce each bit of the row vector by determining an XOR of adjacent ones of the $2^m$ bits of the corresponding row of the fuse array; and the vector generator is operable to produce each bit of the column vector by determining an XOR of adjacent ones of the $2^n$ bits of the corresponding column of the fuse array.

4. The memory of claim 3, wherein: the $2^m$ bits of the corresponding row of the fuse array are sequentially bit 1, bit 2, . . . bit $2^m$ and the vector generator is operable to produce each bit of the row vector by determining a first XOR of bits 1 and 2, a second XOR of a next bit and the first XOR, . . . and a $(2^{m-1})$th XOR of bit $2^m$ and a previous XOR; the $2^n$ bits of the corresponding column of the fuse array are sequentially bit 1, bit 2, . . . bit $2^n$ and the vector generator is operable to produce each bit of the column vector by determining a first XOR of bits 1 and 2, a second XOR of a next bit and the first XOR, . . . and a $(2^{n-1})$th XOR of bit $2^n$ and a previous XOR.

5. The memory of claim 1, wherein: the compression unit is operable to produce each bit of the row checksum by determining a logic combination of at least some of the $2^n$ bits of the row vector; and the compression unit is operable to produce each bit of the column checksum by determining a logic combination of at least some of the $2^m$ bits of the column vector.

6. The memory of claim 5, wherein: the compression unit is operable to produce each bit of the row checksum by determining an XOR combination of at least some of the 2bits of the row vector; and the compression unit is operable to produce each bit of the column checksum by determining an XOR combination of at least some of the $2^m$ bits of the column vector.

7. The memory of claim 6, wherein: each bit of the row vector is represented by an address of n bits, An, . . . A2, A1, one of a least significant bit (LSB) and a most significant bit (MSB) of the row vector is capable of representation by address An=0, . . . A2=0, A1=0, and each sequential bit is capable of representation by an address incremented by one; the compression unit is operable to produce an ith bit of the row checksum by determining a logic combination of an ith set of bits of the row vector for which the respective Aj address bits are 0, where i=1, 3, 5, . . . n−1, and j=1, 2, 3, . . . n; and the compression unit is operable to produce a kth bit of the row checksum by determining a logic combination of a kth set of bits of the row vector for which the respective Aj address bits are 1, where k=2, 4, 6, . . . n.

8. The memory of claim 7, wherein the compression unit is operable to produce each ith bit and each kth bit of the row checksum by determining an XOR of the respective ith and kth sets of bits of the row vector.

9. The memory of claim 8, wherein the bits within each of the respective ith and kth sets of bits are sequentially bit 1, bit 2, . . . bit $2^{n-1}$ and the compression unit is operable to produce each ith bit and each kth bit of the row checksum by determining a first XOR of bits 1 and 2, a second XOR of a next bit and the first XOR, . . . and a $(2^{n-1}-1)$th XOR of bit $2^{n-1}$ and a previous XOR.

10. The memory of claim 6, wherein: each bit of the column vector is represented by an address of m bits, Am, . . . A2, A1, one of a least significant bit (LSB) and a most significant bit (MSB) of the column vector is capable of representation by address Am=0, . . . A2=0, A1=0, and each sequential bit is capable of representation by an address incremented by one; the compression unit is operable to produce an ith bit of the column checksum by determining a logic combination of an ith set of bits of the column vector for which the respective Aj address bits are 0, where i=1, 3, 5, . . . m−1, and j=1, 2, 3, . . . m; and the compression unit is operable to produce a kth bit of the column checksum by determining a logic combination of a kth set of bits of the row vector for which the respective Aj address bits are 1, where k=2, 4, 6, . . . m.

11. The memory of claim 10, wherein the compression unit is operable to produce each ith bit and each kth bit of the column checksum by determining an XOR of the respective ith and kth sets of bits of the column.

12. The memory of claim 11, wherein the bits within each of the respective ith and kth sets of bits are sequentially bit 1, bit 2, . . . bit $2^{n-1}$ and the compression unit is operable to produce each ith bit and each kth bit of the column checksum by determining a first XOR of bits 1 and 2, a second XOR of a next bit and the first XOR, . . . and a $(2^{n-1}-1)$th XOR of bit $2^{n-1}$ and a previous XOR.

13. The memory of claim 1, further comprising at least one storage unit operable to store the row checksum and the column checksum.

14. The memory of claim 13, wherein the at least one storage unit includes a plurality of fusible links to store the row checksum and the column checksum.

15. The memory of claim 13, further comprising an error detector operable to compare the stored row checksum and a subsequently determined row checksum for a difference therebetween, and to compare the stored column checksum and a subsequently determined column checksum for a difference therebetween.

16. The memory of claim 15, wherein the error detector is further operable to determine which of the replacement addresses is faulty based on at least one of the difference between the stored row checksum and the subsequent row checksum, and the difference between the stored column checksum and the subsequent column checksum.

17. The memory of claim 16, wherein: each bit of the row vector is represented by an address of n bits, An, . . . A2, A1, one of a least significant bit (LSB) and a most significant bit (MSB) of the row vector is capable of representation by address An=0, . . . A2=0, A1=0, and each sequential bit is capable of representation by an address incremented by one; the compression unit is operable to produce an ith bit of the row checksum by determining a logic combination of an ith set of bits of the row vector for which the respective Aj address bits are 0, where i=1, 3, 5, . . . n−1, and j=1, 2, 3, n; and the compression unit is operable to produce a kth bit of the row checksum by determining a logic combination of a kth set of bits of the row vector for which the respective Aj address bits are 1, where k=2, 4, 6, . . . n.

18. The memory of claim 17, wherein: the error detector is operable to determine faulty ones of the ith and kth bits of the subsequently determined row checksum based on the difference between the stored row checksum and the subsequently determined row checksum; the error detector is operable to determine one of the addresses of n bits contributing to all of the ith and kth sets of bits that correspond to the faulty bits of the subsequently determined row checksum; and the error detector is operable to determine that the faulty replacement address is one that corresponds to the bit of the row vector that is represented by the determined address of n bits.

19. The memory of claim 16, wherein: each bit of the column vector is represented by an address of m bits, Am, . . . A2, A1, one of a least significant bit (LSB) and a most significant bit (MSB) of the column vector is capable of representation by address Am=0, . . . A2=0, A1=0, and each sequential bit is capable of representation by an address incremented by one; the compression unit is operable to produce an ith bit of the column checksum by determining a logic combination of an ith set of bits of the column vector for which the respective Aj address bits are 0, where i=1, 3, 5, . . . m−1, and j=1, 2, 3, . . . m; and the compression unit is operable to produce a kth bit of the column checksum by determining a logic combination of a kth set of bits of the row vector for which the respective Aj address bits are 1, where k=2, 4, 6, . . . m.

20. The memory of claim 19, wherein: the error detector is operable to determine faulty ones of the ith and kth bits of the subsequently determined column checksum based on the difference between the stored column checksum and the subsequently determined column checksum; the error detector is operable to determine one of the addresses of m bits contributing to all of the ith and kth sets of bits that correspond to the faulty bits of the subsequently determined column checksum; and the error detector is operable to determine that the faulty replacement address is one that corresponds to the bit of the column vector that is represented by the determined address of m bits.

21. A method, comprising:

forming a fuse array from a plurality of replacement addresses, each replacement address identifying one of a plurality of storage elements of a memory array to be replaced by a replacement storage element, each replacement address forming a respective row or column of the fuse array having $2^m$ bit rows and $2^n$ bit columns;

producing a $2^n$ bit row vector based on the $2^m$ bit rows of the fuse array;

producing a $2^m$ bit column vector based on the $2^n$ bit columns of the fuse array;

producing a row checksum from the row vector; and producing a column checksum from the column vector.

22. The method of claim 21, further comprising:

producing each bit of the row vector by determining a logic combination of the 2m bits of a corresponding one of the rows of the fuse array; and producing each bit of the column vector by determining a logic combination of the 2n bits of a corresponding one of the columns of the fuse array.

23. The method of claim 22, further comprising:

producing each bit of the row vector by determining an XOR of adjacent ones of the 2m bits of the corresponding row of the fuse array; and producing each bit of the column vector by determining an XOR of adjacent ones of the 2n bits of the corresponding column of the fuse array.

24. The method of claim 23, wherein: the $2^m$ bits of the corresponding row of the fuse array are sequentially bit 1, bit 2, . . . bit $2^m$ and the step of producing each bit of the row vector includes determining a first XOR of bits 1 and 2, a second XOR of a next bit and the first XOR, . . . and a $(2^{m-1})$ th XOR of bit $2^m$ and a previous XOR; the $2^n$ bits of the corresponding column of the fuse array are sequentially bit 1, bit 2, . . . bit $2^n$ and the step of producing each bit of the column vector includes determining a first XOR of bits 1 and 2, a second XOR of a next bit and the first XOR, . . . and a $(2^{n-1})$ th XOR of bit $2^n$ and a previous XOR.

25. The method of claim 21, further comprising: producing each bit of the row checksum by determining a logic combination of at least some of the $2^n$ bits of the row vector; and producing each bit of the column checksum by determining a logic combination of at least some of the $2^m$ bits of the column vector.

26. The method of claim 25, wherein: the step of producing each bit of the row checksum includes determining an XOR combination of at least some of the $2^n$ bits of the row vector; and the step of producing each bit of the column checksum includes determining an XOR combination of at least some of the $2^m$ bits of the column vector.

27. The method of claim 26, wherein each bit of the row vector is represented by an address of n bits, An, . . . A2, A1, one of a least significant bit (LSB) and a most significant bit (MSB) of the row vector is capable of representation by address An=0, . . . A2=0, A1=0, and each sequential bit is capable of representation by an address incremented by one, and the method further comprises: producing an ith bit of the row checksum includes determining a logic combination of an ith set of bits of the row vector for which the respective Aj address bits are 0, where i=1, 3, 5, . . . n−1, and j=1, 2, 3, . . . n; and producing a kth bit of the row checksum includes determining a logic combination of a kth set of bits of the row vector for which the respective Aj address bits are 1, where k=2, 4, 6, . . . n.

28. The method of claim 27, wherein the steps of producing each ith bit and each kth bit of the row checksum includes determining an XOR of the respective ith and kth sets of bits of the row vector.

29. The method of claim 28, wherein the bits within each of the respective ith and kth sets of bits are sequentially bit 1, bit 2, . . . bit $2^{n-1}$ and the steps of producing each ith bit and each kth bit of the row checksum includes determining a first XOR of bits 1 and 2, a second XOR of a next bit and the first XOR, . . . and a $(2^{n-1}-1)$th XOR of bit $2^{n-1}$ and a previous XOR.

30. The method of claim 26, wherein each bit of the column vector is represented by an address of m bits, Am, . . . A2, A1, one of a least significant bit (LSB) and a most significant bit (MSB) of the column vector is capable of representation by address Am=0, . . . A2=0, A1=0, and each sequential bit is capable of representation by an address incremented by one, and the method further comprises: producing an ith bit of the column checksum by determining a logic combination of an ith set of bits of the column vector for which the respective Aj address bits are 0, where i=1, 3, 5, . . . m−1, and j=1, 2, 3, . . . n; and producing a kth bit of the column checksum by determining a logic combination of a kth set of bits of the row vector for which the respective Aj address bits are 1, where k=2, 4, 6, . . . m.

31. The method of claim 30, wherein the steps of producing each ith bit and each kth bit of the column checksum includes determining an XOR of the respective ith and kth sets of bits of the column.

32. The method of claim 31, wherein the bits within each of the respective ith and kth sets of bits are sequentially bit 1, bit 2, . . . bit $2^{n-1}$ and the steps of producing each ith bit and each kth bit of the column checksum includes determining a first XOR of bits 1 and 2, a second XOR of a next bit and the first XOR, . . . and a $(2^{n-1}-1)$th XOR of bit $2^{n-1}$ and a previous XOR.

33. The method of claim 21, further comprising storing the row checksum and the column checksum.

34. The method of claim 33, further comprising producing a subsequent row checksum and a subsequent column checksum.

35. The method of claim 34, further comprising: determining whether there is a difference between the stored row checksum and the subsequent row checksum; and determining whether there is a difference between the stored column checksum and the subsequent column checksum.

36. The method of claim 35, further comprising: determining which of the replacement addresses are faulty based on at least one of the difference between the stored row checksum and the subsequent row checksum, and the difference between the stored column checksum and the subsequent column checksum.

37. The method of claim 36, wherein each bit of the row vector is represented by an address of n bits, An, . . . A2, A1, one of a least significant bit (LSB) and a most significant bit (MSB) of the row vector is capable of representation by address An=0, . . . A2=0, A1=0, and each sequential bit is capable of representation by an address incremented by one, the method further comprising: producing an ith bit of the row checksum by determining a logic combination of an ith set of bits of the row vector for which the respective Aj address bits are 0, where i=1, 3, 5, . . . n−1, and j=1, 2, 3, . . . n; and producing a kth bit of the row checksum by determining a logic combination of a kth set of bits of the row vector for which the respective Aj address bits are 1, where k=2, 4, 6, . . . n.

38. The method of claim 37, further comprising: determining faulty ones of the ith and kth bits of the subsequent row checksum based on the difference between the stored row checksum and the subsequent row checksum; determining one of the addresses of n bits contributing to all of the ith and kth sets of bits that correspond to the faulty bits of the subsequent row checksum; and determining that the faulty replacement address is one that corresponds to the bit of the row vector that is represented by the determined address of n bits.

39. The method of claim 36, wherein each bit of the column vector is represented by an address of m bits, Am, . . . A2, A1, one of a least significant bit (LSB) and a most significant bit (MSB) of the column vector is capable of representation by address Am=0, . . . A2=0, A1=0, and each sequential bit is capable of representation by an address incremented by one, the method further comprising: producing an ith bit of the column checksum by determining a logic combination of an ith set of bits of the column vector for which the respective Aj address bits are 0, where i=1, 3, 5, . . . m−1, and j=1, 2, 3, . . . m; and producing a kth bit of the column checksum by determining a logic combination of a kth set of bits of the row vector for which the respective Aj address bits are 1, where k=2, 4, 6, . . . m.

40. The method of claim 39, further comprising: determining faulty ones of the ith and kth bits of the subsequent column checksum based on the difference between the stored column checksum and the subsequent column checksum; determining one of the addresses of m bits contributing to all of the ith and kth sets of bits that correspond to the faulty bits of the subsequently determined column checksum; and determining that the faulty replacement address is one that corresponds to the bit of the column vector that is represented by the determined address of m bits.

* * * * *